(12) United States Patent
Boyanov et al.

(10) Patent No.: US 7,303,989 B2
(45) Date of Patent: Dec. 4, 2007

(54) USING ZEOLITES TO IMPROVE THE MECHANICAL STRENGTH OF LOW-K INTERLAYER DIELECTRICS

(75) Inventors: Boyan Boyanov, Portland, OR (US); Grant M. Kloster, Lake Oswego, OR (US); Michael D. Goodner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 10/995,925

(22) Filed: Nov. 22, 2004

(65) Prior Publication Data
US 2006/0108687 A1    May 25, 2006

(51) Int. Cl.
*H01L 21/4763* (2006.01)
(52) U.S. Cl. ............... 438/637; 438/623; 438/780; 257/762
(58) Field of Classification Search ........... 438/637
See application file for complete search history.

(56) References Cited

U.S. PATENT DOCUMENTS

| | | | |
|---|---|---|---|
| 5,968,333 A * | 10/1999 | Nogami et al. | 205/184 |
| 6,329,062 B1 | 12/2001 | Gaynor | |
| 6,699,797 B1 | 3/2004 | Morris et al. | |
| 2004/0028809 A1 | 2/2004 | Bein et al. | |
| 2004/0050250 A1* | 3/2004 | Pinnau et al. | 95/45 |
| 2004/0091419 A1 | 5/2004 | Ogihara et al. | |
| 2005/0107242 A1* | 5/2005 | Deng et al. | 502/4 |

FOREIGN PATENT DOCUMENTS

JP      2004 079592      3/2004
WO    WO 2005/050727    6/2005

OTHER PUBLICATIONS

Larlus et al, "Silicalite-1/polymer films with low-k dielectric constants," Appl. Surf. Sci. 226 (2004), 155-160.*
Yan et al., "Pure-Silica Zeolite Low-k Dielectric Thin Films" Advanced Materials 2001, No. 13, pp. 746-749.
Kickelbick, G et al., "Concepts for the Incorporation of Inorganic Building Blocks Into Organic Polymers on a Nanoscale", Progress in Polymer Science 28 (2003) 83-114.
Patent Application entitled "Forming a Dielectric Layer Using a Hydrocarbon-Containing Precursor" filed Feb. 28, 2003, U.S. Appl. No. 10/377,061.
Wang, Z et al., "Pure-Silica Zeolite Low-K Dielectric Thin Films" Advanced Materials, Wiley Vch, Weinheim, DE, vol. 13, No. 10, May 17, 2001, pp. 746-749.
Wang, Z, et al., "Pure Silica Zeolite Films as Low-K Dielectrics by Spin-On of Nanoparticles Suspensions" Advanced Materials, Wiley Vch, Weinheim, DE, vol. 13, No. 19, Oct. 2, 2001, pp. 1463-1466.
PCT International Preliminary Report on Patentability and Written Opinion, International Application No. PCT/US2005/042333, May 22, 2007, 9 pgs.

* cited by examiner

*Primary Examiner*—Carl Whitehead, Jr.
*Assistant Examiner*—Colleen E. Rodgers
(74) *Attorney, Agent, or Firm*—George Chen

(57) ABSTRACT

A method for impregnating the pores of a zeolite low-k dielectric layer with a polymer, and forming an interconnect structure therein, thus mechanically strengthening the dielectric layer and preventing metal deposits within the pores.

9 Claims, 8 Drawing Sheets

USING ZEOLITES TO IMPROVE THE MECHANICAL STRENGTH OF LOW-K INTERLAYER DIELECTRICS

BACKGROUND

Silica films, such as SiO2, are used in the microelectronics industry as dielectrics. A dielectric is described by its dielectric constant, more commonly known as the k-value of the dielectric. Dielectrics are used to isolate metal lines or layers from one another. Using a dielectric with a low dielectric constant helps to lessen crosstalk, the undesired capacitive or inductive interaction of one part of the circuit to another. As device density on integrated circuits increases, the metal lines become smaller, and the distance between metal layers decreases. As device geometries decrease, crosstalk effects become significant. Crosstalk effects can be reduced by lowering the k-value of the dielectric. Current technology uses dielectrics with a k-value between 2.5 and 4.0.

Silica has a dielectric constant of about 4.0, which is too high to be useful for next generation integrated circuits. Since air has a dielectric constant of 1.0, one way to lower the dielectric constant of silica is to incorporate voids or pores into the silica. There are several drawbacks to using this approach in an integrated circuit manufacturing process. First, porous dielectrics are generally not mechanically stable enough to support subsequent polishing operations. Additionally, the porous dielectric may allow transport of metal through the dielectric layer.

BRIEF DESCRIPTION OF THE DRAWINGS

A better understanding of the present invention can be obtained from the following detailed description in conjunction with the following drawings, in which.

DETAILED DESCRIPTION OF THE PRESENT INVENTION

The terms chip, integrated circuit, monolithic device, semiconductor device, and microelectronic device, are often used interchangeably in this field. The present invention is applicable to all of the above as they are generally understood in the field.

The terms contact and via both refer to structures for electrical connection of conductors from different interconnect levels. These terms are sometimes used in the art to describe both an opening in an insulator in which the structure will be completed, and the completed structure itself. For purposes of this disclosure, contact and via refer to the completed structure.

The expression low dielectric constant material refers to materials having a lower dielectric constant than silicon dioxide, which has a dielectric constant of 4. For example, organic polymers, amorphous fluorinated carbons, nanofoams, silicon based insulators containing organic polymers, carbon doped oxides of silicon and fluorine doped oxides of silicon have lower dielectric constants than silicon dioxide.

The letter k is often used to refer to dielectric constant. Similarly, the terms high-k and low-k are used in this field to refer to high dielectric constant and low dielectric constant respectively, where high means greater than the dielectric constant of silicon dioxide, and low means lower than the dielectric constant of silicon dioxide.

The parasitic capacitance seen by an interconnect line is a function of the distance to another conductor and the dielectric constant of the material between the conductors. However, increasing the spacing between interconnect lines increases the physical size, and thus the cost, of an integrated circuit. Therefore, in order to manufacture integrated circuits with low parasitic capacitance between interconnect lines, it is desirable to electrically isolate the conductors from each other with an insulator having a low dielectric constant.

Figure 1:
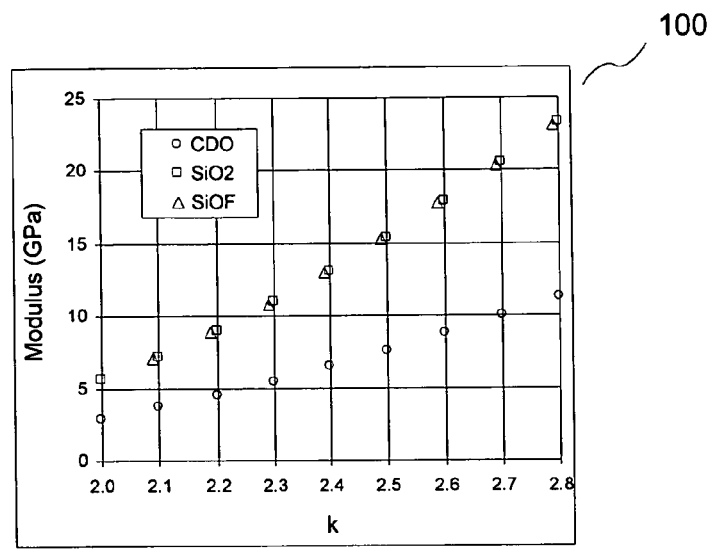
FIG. 1 is an illustration of a graph showing the mechanical strength of low-k dielectric materials as a function of dielectric constant.

One way to reduce the adverse effects of parasitic capacitance is to use low-k materials as insulators in advanced microelectronics. To achieve low dielectric constants, one can introduce porosity into the dielectric film. While increasing the porosity of a dielectric lowers the k-value of the film, it also lowers the mechanical strength of the film. FIG. 1 is a graph (100) which illustrates the modulus of a film as a function of k-value for three low-k dielectric films: carbon-doped oxide (CDO), silicon dioxide (SiO2), and fluorinated silicon oxide (SiOF). As the porosity of the dielectric increases, the k-value decreases, and the modulus or mechanical strength of the film decreases as well, thus making it more difficult to integrate these porous dielectrics into the semiconductor manufacturing process.

Figure 2:
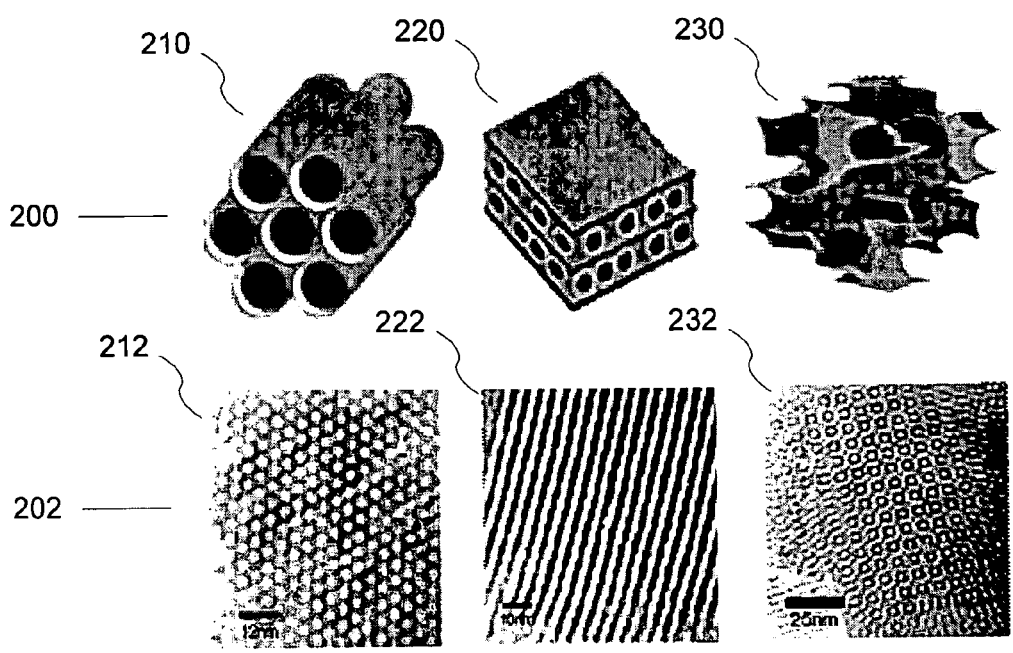
FIG. 2 is an illustration of hexagonal, lamellar, and cubic mesoporous materials.

Because of their ordered nature, zeolites have significantly higher strengths than porous silicon oxide based materials such as porous SiO2, SiOF, and CDO. A zeolite is characterized by a high degree of ordered porosity, a high mechanical strength, and a low k-value. FIG. 2 illustrates images of porous zeolite structures 200 and their corresponding transmission electron micrographs 202. Hexagonal 210, 212 and lamellar 220, 222 structures are closed systems that do not allow transport of materials through the surface of the film. Cubic structures 230, 232 have channels running through the entire film that allow transport to and from the surface.

The inherent porosity and permeability of zeolite dielectric layers poses significant integration challenges when using these porous dielectrics in the semiconductor manufacturing process. Chemical uptake may occur during etch or clean, significantly increasing the dielectric constant. Porosity may compromise the integrity of the metal barrier layer, leading to poor gap fill and interline leakage. Finally, permeability and ion-exchange properties can result in trapping of mobile ions, catalysts of undesirable reactions during barrier atomic layer deposition (ALD).

Figure 3:
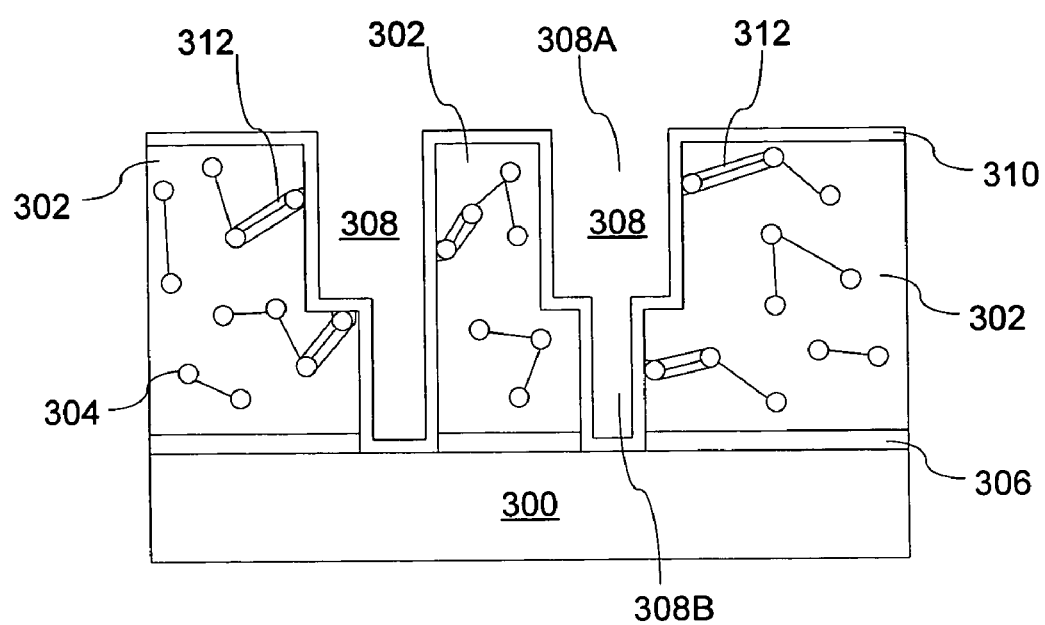
FIG. 3 is an illustration of a cross section of a damascene opening in a porous zeolite.

FIG. 3 illustrates a cross sectional view of a porous zeolite low-k dielectric layer in a semiconductor interconnect structure. A porous zeolite layer (302) containing pores (304) is formed on an etch stop layer (306) and an underlying semiconductor substrate (300). The substrate is typically a wafer upon which other semiconductor manufacturing operations have been performed to form various electrical components, including, but not limited to transistors and conductive interconnections. The etch stop layer may comprise silicon nitride, silicon carbide, or another material.

Damascene or dual damascene openings (308), which may include trench (308A) and/or via (308B) openings are formed in the porous zeolite layer. Trenches (308A) are formed in the zeolite layer (302), while via openings (308B) are formed through both the zeolite layer (302) and etch stop layer (306). A metal barrier layer (310) is formed over the damascene openings. The metal barrier layer may be formed by chemical vapor deposition (CVD) or by atomic layer deposition (ALD).

When the metal barrier layer is deposited over the porous zeolite layer, metal deposits may be formed inside of the pores (312). This may lead to electrical shorts and/or a low breakdown voltage for the dielectric.

By impregnating the pores of the zeolite layer with a second low-k dielectric, the internal pores of the zeolite may be sealed, yet the zeolite layer will retain its desirable mechanical and low-k properties.

Figure 4A:
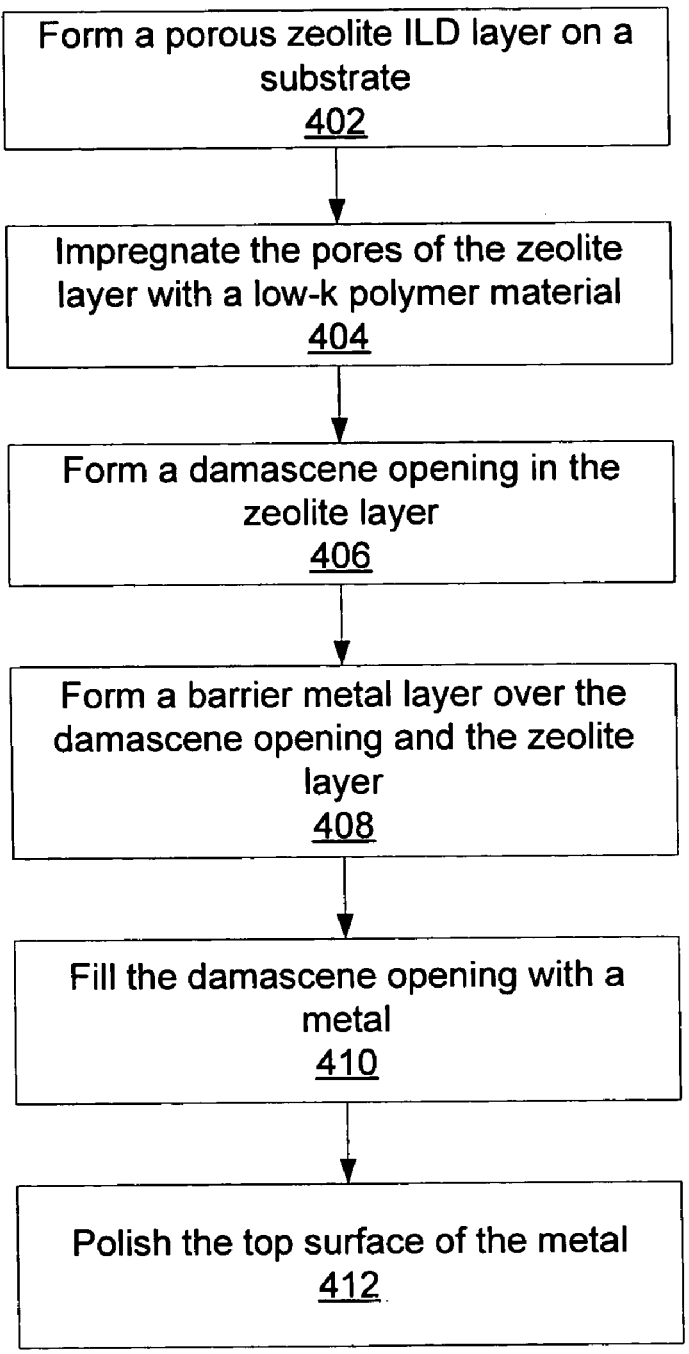
FIGS. 4A-4B are flow diagrams illustrating processes according to embodiments of the present invention.

FIG. 4A is a flow diagram illustrating a process in accordance with one embodiment of the present invention. First, as illustrated in block 402, a porous zeolite low-k dielectric layer is formed on a substrate. The zeolite may be synthesized either in situ on the wafer via spin-coating and subsequent calcination, or a priori as a nanoparticle suspension followed by calcination.

Next, as shown in block 404, the zeolite is impregnated with another low-k material. The low-k material may be a spin-on or plasma-deposited monomer or polymer, or may be another low-k material which is able to penetrate the pores of the zeolite. Alternately, the low-k material may be a polymer which is dissolved in another material, or may be a polymer which is part of a mixture with another material. Impregnation of the zeolite by the low-k material may be either complete or partial.

Once the pores of the zeolite have been partially or completely filled with a polymer or other low-k material, a damascene or dual damascene opening may be formed in the zeolite layer, as shown by block 406.

Next, as shown in block 408, a barrier layer metal may be formed over the damascene opening and the zeolite layer. In one embodiment, the barrier layer metal may be comprised of copper or an alloy of copper.

After the barrier layer metal has been formed, the damascene opening may be filled with a metal, such as, but not limited to copper or a copper alloy as shown in block 410. Thus, a damascene or dual damascene interconnect structure is formed.

After the dual damascene structures are formed, excess copper and barrier layer material may be removed, typically by a chemical mechanical polishing (CMP) process, as illustrated in block 412. Although dual damascene structures are described, damascene or other interconnect structures may be formed within the zeolite dielectric layer as well.

Figure 4B:
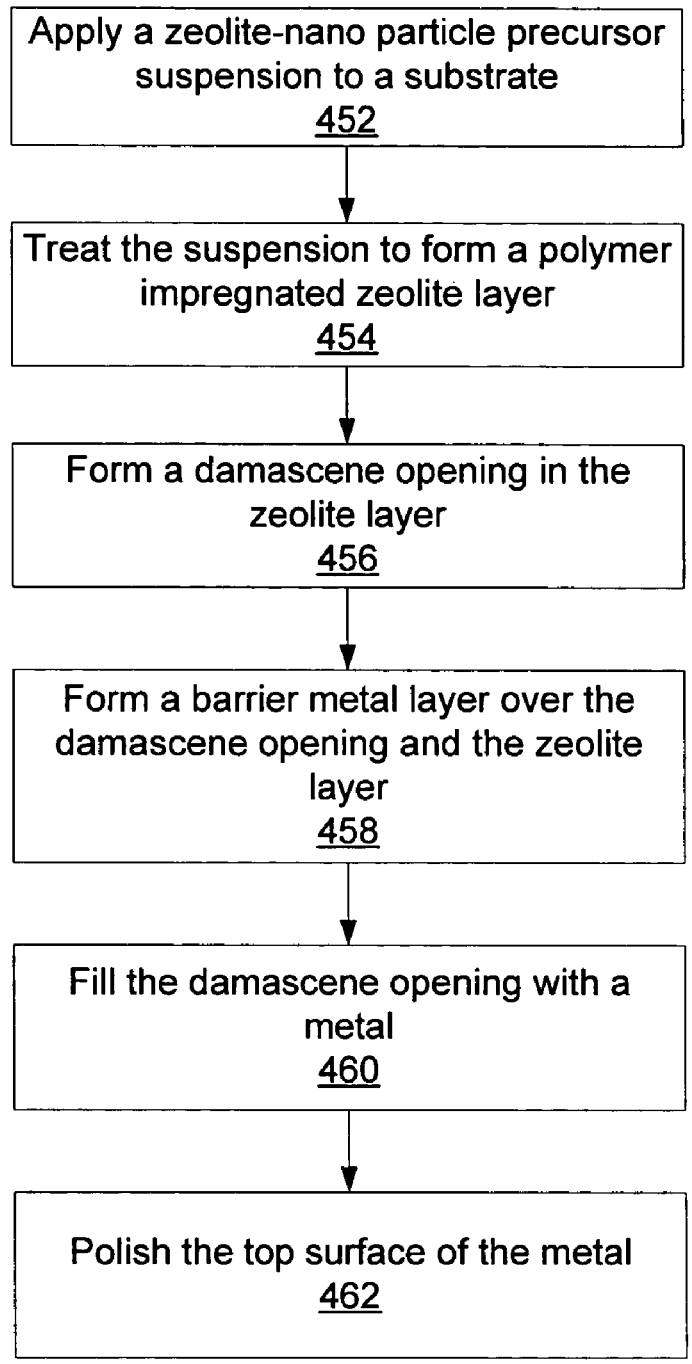

FIG. 4B is a flow diagram illustrating a process in accordance with another embodiment of the present invention. In this embodiment, the zeolite layer may be formed using a zeolite nanoparticle/low-k precursor suspension applied directly to the wafer, as illustrated by block 452. Next, the suspension may be treated to form a polymer impregnated zeolite layer, as shown in block 454. In one embodiment, calcination may be used to treat the suspension. Calcination of the suspension will allow the low-k precursor to polymerize within the pores of the zeolite. Using this method, the zeolite nanoparticles can be prepared with a significantly lower k-value (k<2.0) than fully dense silica (k=3.9).

After the suspension has been treated to form a zeolite layer having polymer-impregnated pores, subsequent processing may occur, including formation of a damascene or dual damascene opening in the zeolite layer (block 456), formation of a barrier metal layer over the damascene opening and the zeolite layer (block 458), filling the damascene opening with a metal (block 460), and polishing the top surface of the metal (block 462). Each of these processes is described in greater detail above, in conjunction with FIG. 4A.

FIGS. 5A through 5G illustrate cross-sectional views of a zeolite dielectric layer formed in accordance with embodiments of the process set forth in FIG. 4 and described above.

Figure 5A:
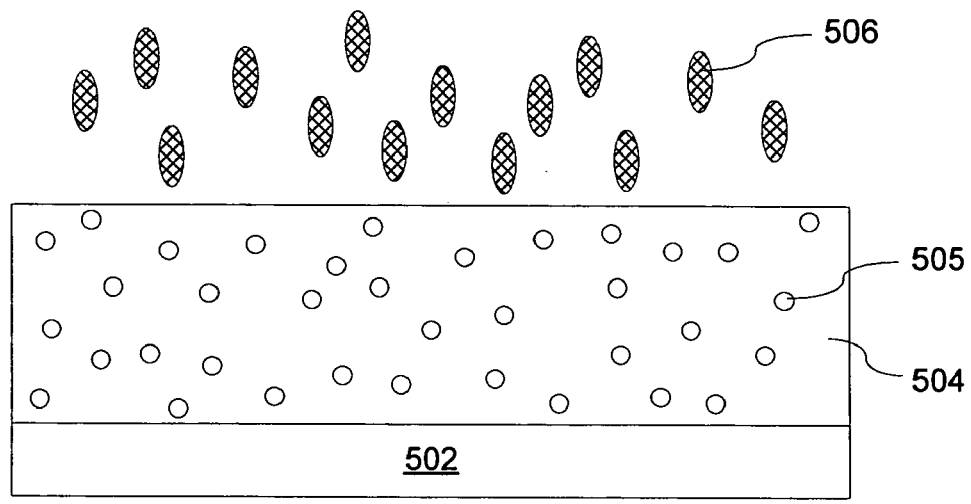
FIGS. 5A-5G are illustrations of cross sections of a zeolite dielectric layer according to embodiments of the present invention.

FIG. 5A illustrates a porous zeolite layer (504) having pores (505) formed on a substrate (502). The porous zeolite layer (504) is exposed to a low-k polymer precursor (506). The zeolite layer (504) may be impregnated with the precursor (506) using vapor, liquid, or supercritical fluid exposure. One appropriate precursor which may be used is divinyl siloxane-benzocyclobutene (DVS-BCB), which forms a low-k siloxane-organic hybrid polymer upon polymerization. Another group of precursors which may be used are the CDO related precursors, which form a low-k silicon dioxide-based dielectric. In one embodiment, the polymer precursor may be dissolved in another material, or may be part of a mixture with another material.

Polymerization of the precursor (506) may be initiated via thermal, plasma, or other means to facilitate polymerization during or subsequent to the impregnation process. In one embodiment, polymerization may be initiated by applying heat to the zeolite layer and the polymer precursor. In another embodiment, polymerization may be initiated by exposing the zeolite layer and the polymer precursor to a plasma.

Figure 5B:
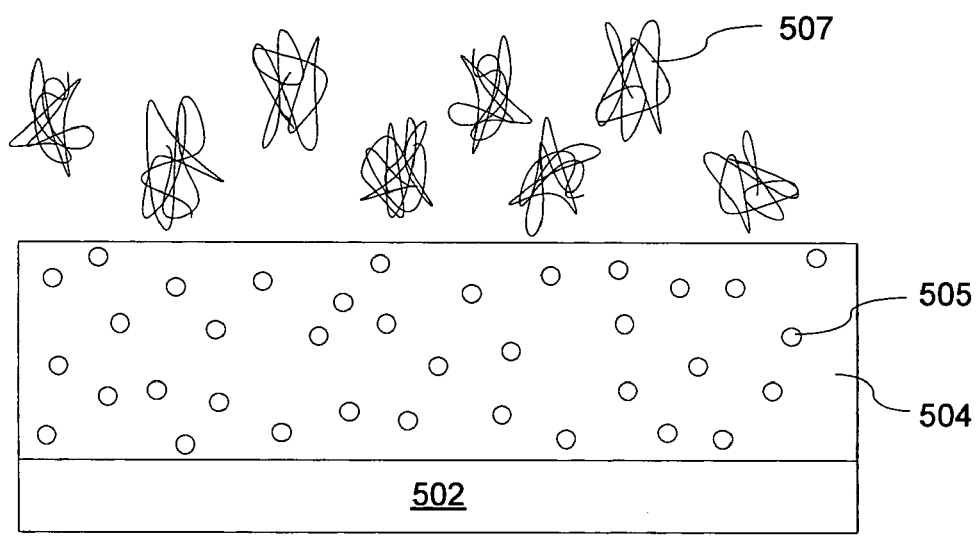

In another embodiment, illustrated in FIG. 5B, the pores (505) of porous zeolite (504) may be directly impregnated with a long-chain, non-crosslinked polymer (507), such as paralyene, poly(arylene ether)s (such as FLARE™ from Honeywell), polyphenylene derivatives (such as a non-crosslinked version of SiLK™ from Dow Chemical), or another thermally robust, low-k dielectric material. Impregnation may be performed in either liquid or supercritical solution, to enhance diffusion of the polymer into the zeolite structure. In one embodiment, the polymer may be dissolved in another material, or may be part of a mixture with another material.

In another embodiment, the zeolite may be impregnated by using a hybrid method in which a macromonomer, such as oligomeric polyphenylene, is introduced into the zeolite matrix and then subsequently reacted to form a crosslinked network. The ability to modify the chemical properties of the zeolite host over a wide range by using specific additives makes it possible to tailor the zeolite to specific applications.

Figure 5C:
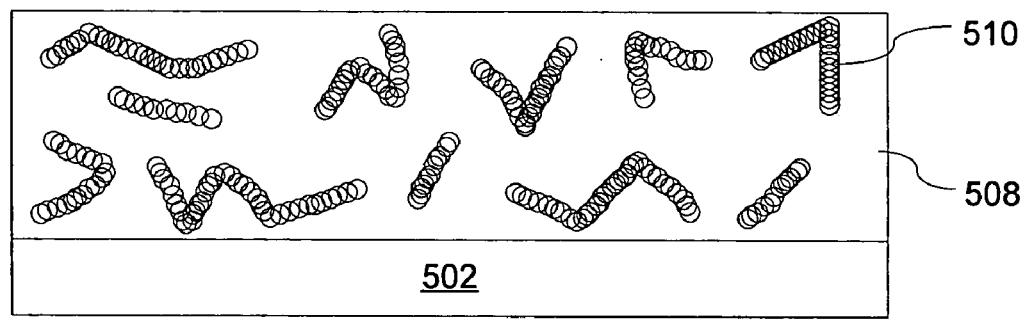

FIG. 5C illustrates the zeolite layer (508) on a substrate (502) after the pores have been partially or fully impregnated with a polymer or other low-k material (510). Because the pores of the zeolite have been filled with a low-k polymer, the zeolite is more mechanically robust. The polymer-filled zeolite layer may act as mechanical reinforcement for the interlayer dielectric (ILD) stack during subsequent process operations. Also, because the k-value of both the zeolite and the polymer is low, the k-value of the resulting stack will be low.

Figure 5D:
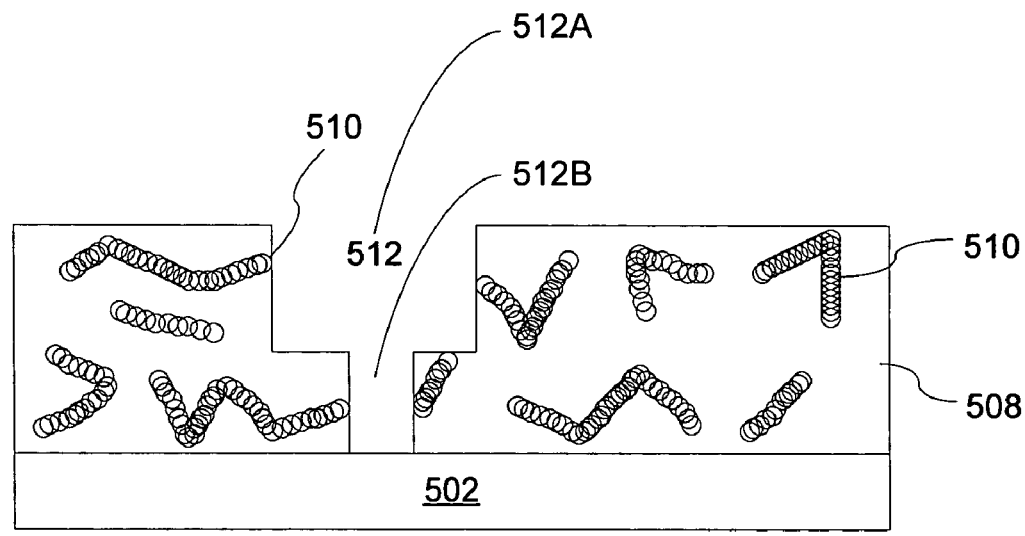

FIG. 5D illustrates the polymer-filled zeolite layer (508) after a damascene opening (512) has been formed. The damascene opening (512) may include a via region (512B) and a trench region (512A), and may be formed by photolithography and etch operations. Because the pores of the zeolite are sealed by the polymer (510), chemical uptake, ion exchange, and catalysis are prevented during the photolithography, etch, and subsequent operations.

Figure 5E:
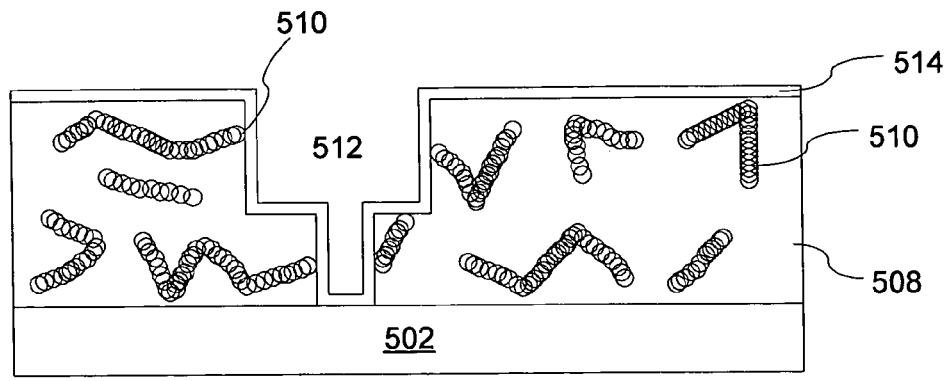

Next, as shown in FIG. 5E, a metal barrier layer (514) is formed over the damascene openings. The metal barrier layer may be formed by chemical vapor deposition (CVD) or by atomic layer deposition (ALD). Because the pores of the zeolite (508) are filled by a polymer (510), the barrier metal may not penetrate the zeolite layer. Thus, metal deposits may not form in the pores, and the resulting zeolite ILD layer may be more electrically robust.

Figure 5F:
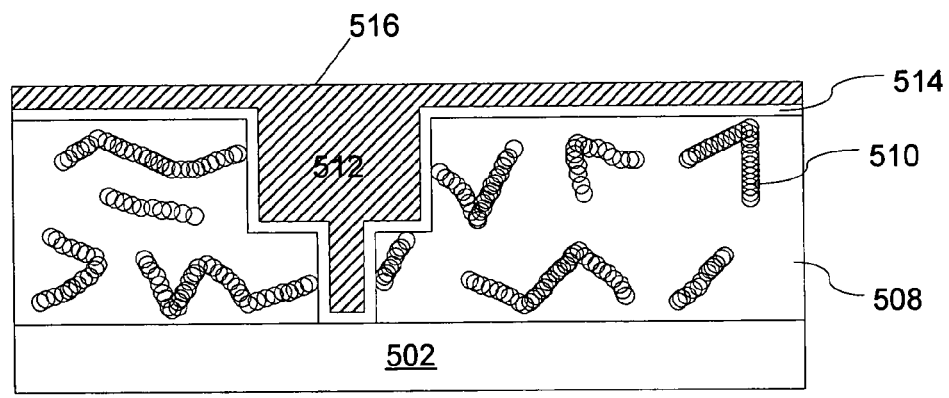

FIG. 5F illustrates the structure of FIG. 5E after the damascene opening (512) is filled with a metal (516). In one embodiment, the metal is copper or a copper alloy. The metal (516) forms copper interconnects, creating damascene or dual damascene interconnect structures.

Figure 5G:
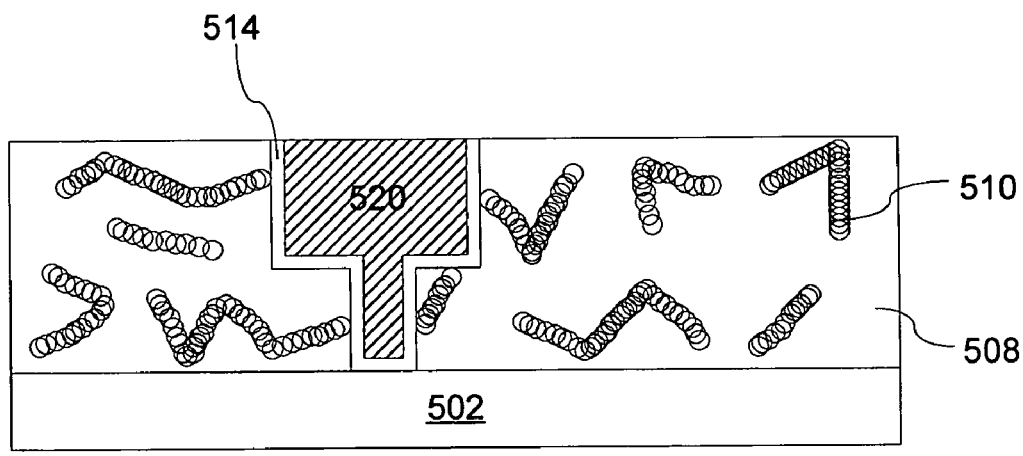

After the damascene or dual damascene structures are formed, excess copper and barrier layer material is removed, typically by a chemical mechanical polishing (CMP) process. The resulting structure is illustrated in FIG. 5G. Damascene or dual damascene structures (520) are formed within a zeolite layer having polymer filled pores. The polymer-filled zeolite (508) may act as a mechanical reinforcement for the inter-layer dielectric (ILD) stack during the CMP process and subsequent manufacturing operations.

Thus, as described above, a porous zeolite ILD may be impregnated with a second low-k dielectric, such as a polymer, so as to seal the internal pores of the zeolite. The resulting structure may have a greater mechanical strength than a porous zeolite, because the pores have been filled with a polymer. Additionally, the k-value of the resulting structure may remain low because both the zeolite and polymer are low-k materials.

In the foregoing specification, the invention has been described with reference to specific exemplary embodiments thereof. It will, however, be evident that various modifications and changes may be made thereto without departing from the broader spirit and scope of the invention as set forth herein. The specification and drawings are, accordingly, to be regarded in an illustrative sense rather than a restrictive sense.

We claim:

1. A method comprising:
   forming a zeolite layer on a substrate;
   introducing a polymer precursor to the zeolite layer wherein the polymer precursor is a macromonomer that is low-k and non-crosslinked;
   diffusing the macromonomer to penetrate internal pores of the zeolite layer;
   sealing the internal pores of the zeolite layer with a crosslinked network;
   forming a damascene opening in the zeolite layer; and
   forming a barrier layer over the damascene opening and the zeolite layer.

2. The method of claim 1, wherein sealing the internal pores of the zeolite layer comprises exposing the zeolite layer to the polymer precursor and subsequently initiating polymerization.

3. The method of claim 2, wherein the polymer precursor is in liquid form.

4. The method of claim 2, wherein initiating polymerization comprises heating the zeolite layer and the polymer precursor.

5. The method of claim 2, wherein initiating polymerization comprises exposing the zeolite layer and the polymer precursor to a plasma.

6. The method of claim 1, wherein the barrier layer comprises a layer of metal.

7. The method of claim 1, further comprising filling the opening with a metal layer.

8. The method of claim 7, further comprising polishing the metal layer.

9. The method of claim 7, wherein the metal layer comprises a copper alloy.

* * * * *